United States Patent
Kirt et al.

(10) Patent No.: US 12,340,927 B2
(45) Date of Patent: Jun. 24, 2025

(54) DETECTION OF MAGNETIC PULSE AND ORIENTATION WHEN MAGNETIZING

(71) Applicant: UNOMEDICAL A/S, Lejre (DK)

(72) Inventors: Jesper Kirt, Skibby (DK); Bo Justesen, Ringsted (DK); Tanja Lykke Petersen, Regstrup (DK)

(73) Assignee: Unomedical A/S, Lejre (DK)

( * ) Notice: Subject to any disclaimer, the term of this patent is extended or adjusted under 35 U.S.C. 154(b) by 602 days.

(21) Appl. No.: 17/225,649

(22) Filed: Apr. 8, 2021

(65) Prior Publication Data

US 2021/0319940 A1 Oct. 14, 2021

Related U.S. Application Data

(63) Continuation of application No. PCT/EP2021/059240, filed on Apr. 8, 2021.

(60) Provisional application No. 63/007,469, filed on Apr. 9, 2020.

(51) Int. Cl.
*H01H 47/00* (2006.01)
*G01R 33/02* (2006.01)
*H01F 13/00* (2006.01)

(52) U.S. Cl.
CPC ........... *H01F 13/003* (2013.01); *G01R 33/02* (2013.01)

(58) Field of Classification Search
CPC .............................. H01F 13/003; G01R 33/02
USPC ....................................................... 361/143
See application file for complete search history.

(56) References Cited

U.S. PATENT DOCUMENTS

| | | | | |
|---|---|---|---|---|
| 3,089,988 A | * | 5/1963 | Stillings | G05D 3/1445 307/154 |
| 3,959,735 A | * | 5/1976 | GrosJean | H03F 1/52 330/207 P |
| 3,978,400 A | * | 8/1976 | Pettit | H02H 3/347 361/96 |
| 4,777,380 A | | 10/1988 | Wathelet | |
| 5,565,774 A | * | 10/1996 | Dudding | G01R 33/12 324/225 |

(Continued)

FOREIGN PATENT DOCUMENTS

| | | |
|---|---|---|
| EP | 0672261 A1 | 4/1994 |
| JP | 2015-49147 A | 3/2015 |
| JP | 2018-179660 A | 11/2018 |

OTHER PUBLICATIONS

International Search Report; European Patent Office; International Application No. PCT/EP2021/059240; Jul. 5, 2021; 4 pages.

(Continued)

*Primary Examiner* — Jared Fureman
*Assistant Examiner* — Lucy M Thomas
(74) *Attorney, Agent, or Firm* — TAFT STETTINIUS & HOLLISTER LLP; Ryan O. White; Derek B. Lavender

(57) ABSTRACT

Disclosed is a magnetizing pulse detector that detects magnetizing pulses produced by a magnetizing coil; the magnetizing pulse detector comprising: a measuring coil configured to generate a measuring pulse in response to a magnetizing pulse produced by the magnetizing coil; a measuring pulse detection circuit configured to generate a detection signal based on the measuring pulse generated by the measuring coil; and a duration extension circuit configured to generate an extended detection signal based on the detection signal generated by the measuring pulse detection circuit.

20 Claims, 4 Drawing Sheets

(56) References Cited

U.S. PATENT DOCUMENTS

| | | | |
|---|---|---|---|
| 6,522,517 B1 | 2/2003 | Edel | |
| 9,466,417 B2 * | 10/2016 | Jefferies | G01R 15/183 |
| 2003/0164765 A1 * | 9/2003 | Sumi | G01R 33/02 |
| | | | 340/572.1 |

OTHER PUBLICATIONS

Written Opinion of the International Searching Authority; European Patent Office; International Application No. PCT/EP2021/059240; Jul. 5, 2021; 6 pages.

First Office Action for CN202180025977.7 and english translation thereof; received Apr. 23, 2025; 13 Pages.

* cited by examiner

DETECTION OF MAGNETIC PULSE AND ORIENTATION WHEN MAGNETIZING

This application is a continuation of International Application No. PCT/EP2021/059240 filed Apr. 8, 2021 and claims the priority of U.S. Provisional Application No. 63/007,469, filed Apr. 9, 2020. The disclosures of which are hereby incorporated herein in their entirety.

FIELD OF THE DISCLOSURE

The present disclosure relates to magnetizing devices and detectors, and more specifically to a detection device for detection of a magnetizing pulse and one or more parameters.

BACKGROUND

When magnetizing a material with an electric pulse, it can be important to know which direction that the pulse travels. This can be important even when you have a device that can indicate how it discharges the pulse when magnetizing. When the magnetizing device is part of a larger production set-up, it can be important to know the orientation of the magnet's field and validate that the device has completed the magnetizing process. This can be difficult since the pulse used in the process, is typically not long enough to be detected on its own.

When using a magnetizing pulse to create an electric current, the pulse is typically measured in micro seconds with an intensity level above 50 volts. This short pulse duration and high intensity can make it hard to hard to get readings on the magnetizing pulse. When using currents for information, you typically want to either have a long pulse duration when the voltage is high, or a low voltage range (for example, 3-5 volts) when the pulse duration is short. Current solutions for measuring a magnetizing pulse are expensive and complicated to implement into a production line. This combined with a desire to have a robust and easy to maintain solution in production lines means that the cost of implementing current solutions on the market is difficult in multiple high-volume production lines.

It would be desirable to have a relatively inexpensive, robust system and method to detect and validate a magnetizing process.

SUMMARY

A magnetizing pulse detector is disclosed that detects magnetizing pulses produced by a magnetizing coil; where the magnetizing pulse detector includes a measuring coil, a measuring pulse detection circuit and a duration extension circuit. The measuring coil is configured to generate a measuring pulse in response to a magnetizing pulse produced by the magnetizing coil. The measuring pulse detection circuit is configured to generate a detection signal based on the measuring pulse generated by the measuring coil. The duration extension circuit is configured to generate an extended detection signal based on the detection signal generated by the measuring pulse detection circuit. The measuring coil can be enclosed in a first housing, and the measuring pulse detection and duration extension circuits can be enclosed in a second housing.

The measuring pulse detection circuit can include Zener diodes connected in parallel to one another and connected in parallel with the measuring coil. Each of the Zener diodes can have a Zener voltage of 24 volts. The measuring pulse detection circuit can also include a rectifier diode, where the cathode of the rectifier diode is coupled to either the positive or negative side of the measuring coil, and the anode of the rectifier diode is coupled to the anodes of the plurality of parallel-connected Zener diodes.

The duration extension circuit can be configured to trigger only when the detection signal exceeds a pulse threshold that indicates the magnetizing pulse produced by the magnetizing coil was sufficient to successfully magnetize a specimen. The duration extension circuit can include a detection signal hold relay configured to hold the detection signal until reset by a reset signal. The detection signal hold relay can be a solid state relay configured to trigger only when the detection signal exceeds a pulse threshold that indicates the magnetizing pulse produced by the magnetizing coil was sufficient to successfully magnetize a specimen.

The measuring pulse detection circuit can include first and second measuring pulse smoothing portions configured to smooth oscillations in the measuring pulse, and a steering portion configured to direct a negative polarity measuring pulse to the first measuring pulse smoothing portion, and a positive polarity measuring pulse to the second measuring pulse smoothing portion. The first measuring pulse smoothing portion can generate a negative polarity detection signal when the negative polarity measuring pulse is directed to the first measuring pulse smoothing portion, and the second measuring pulse smoothing portion can generate a positive polarity detection signal when the positive polarity measuring pulse is directed to the second measuring pulse smoothing portion.

The steering portion can include first and second rectifier diodes. The cathode of the first rectifier diode can be connected to a positive side of the measuring coil to pass a negative polarity measuring pulse to the first measuring pulse smoothing portion and to block a positive polarity measuring pulse. The cathode of the second rectifier diode can be connected to a negative side of the measuring coil to pass a positive polarity measuring pulse to the second measuring pulse smoothing portion and to block a negative polarity measuring pulse.

The first measuring pulse smoothing portion can include a first set of Zener diodes connected in parallel, and the second measuring pulse smoothing portion can include a second set of Zener diodes connected in parallel. The anode of the first rectifier diode can be connected to the anodes of the first plurality of Zener diodes, and the anode of the second rectifier diode can be connected to the anodes of the second plurality of Zener diodes. The measuring coil can be enclosed in a first housing, the measuring pulse detection and duration extension circuits can be enclosed in a second housing, and an interconnect cable can connect the first and second housings. The interconnect cable can include a first line configured to couple the positive side of the measuring coil to the cathode of the first rectifier diode, a second line configured to couple the negative side of the measuring coil to the cathode of the second rectifier diode; and a cable screen configured to couple to safety earth.

The duration extension circuit can include a negative pulse detection circuit configured to trigger based on the negative polarity detection signal, and a positive pulse detection circuit configured to trigger based on the positive polarity detection signal. The negative pulse detection circuit can be configured to trigger only when the negative polarity detection signal exceeds a negative pulse threshold that indicates the magnetizing pulse produced by the magnetizing coil was sufficient to successfully magnetize a specimen with negative polarity; and the positive pulse detection circuit can be configured to trigger only when the positive polarity detection signal exceeds a positive pulse threshold that indicates the magnetizing pulse produced by the magnetizing coil was sufficient to successfully magnetize the specimen with positive polarity. The negative pulse detection circuit can include a negative pulse detection hold relay configured to hold the extended detection signal until reset by a reset signal; and the positive pulse detection circuit can include a positive pulse detection hold relay configured to hold the extended detection signal until reset by the reset signal. The negative pulse detection hold relay and the positive pulse detection hold relay can be solid state relays. The reset signal can be generated external to the duration extension circuit.

BRIEF DESCRIPTION OF THE DRAWINGS

The above-mentioned aspects of the present disclosure and the manner of obtaining them will become more apparent and the disclosure itself will be better understood by reference to the following description of the embodiments of the disclosure, taken in conjunction with the accompanying drawings, wherein.

Corresponding reference numerals are used to indicate corresponding parts throughout the several views.

DETAILED DESCRIPTION

The embodiments of the present disclosure described below are not intended to be exhaustive or to limit the disclosure to the precise forms in the following detailed description. Rather, the embodiments are chosen and described so that others skilled in the art may appreciate and understand the principles and practices of the present disclosure.

Magnetizing equipment is available for magnetizing small isotropic (un-magnetized) magnets in a desired direction. The magnetizing equipment can have a control unit with a large power supply and a large bank of capacitors. When the magnetizing equipment is activated, the power supply can fill the capacitors with charge, and the capacitors can shoot the charge into a magnetizing coil through heavy gauge wires. The energy can be very high, for example 2100 volts and 5000 amperes, and the duration can be very short, for example 300 microseconds (μsec). It is desirable to be able to determine whether the magnetizing process successfully occurred, and in which polarity direction it was performed. The control unit does not give reliable feedback on these parameters. An off-the-shelf sensor or detector is not available, that in a simple manner, can detect this very short duration magnetizing pulse and also tell the direction. It is desirable that the detector device be a simple, low-cost device that does not require a computer or a highly advanced system, for example a Helmholtz coil measuring system. It is desirable that the detector device can detect the short duration magnetizing pulse, effectively extend its duration time to make the magnetizing pulse more readily detectable, to validate that the magnetizing process of a material occurred successfully, and to identify the orientation/polarity of the magnetic field created.

Figure 1:
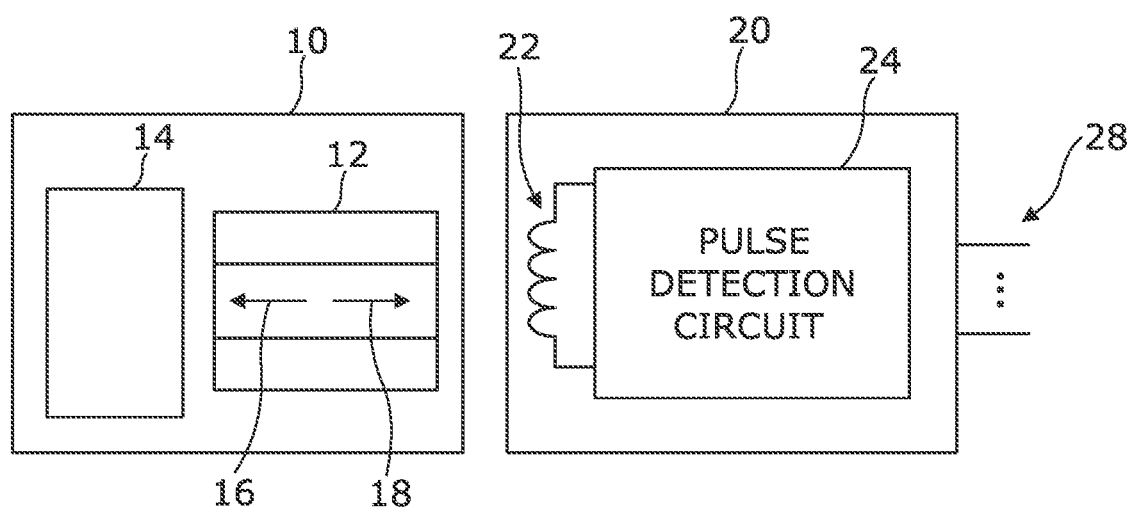
FIG. 1 illustrates a magnetizing device and a magnetizing pulse detector.

FIG. 1 illustrates a magnetizing device 10 and a magnetizing pulse detector 20. The magnetizing device 10 includes a magnetizing coil 12 and a control unit 14. Arrows 16, 18 indicate the field axis for positive and negative polarity magnetizing pulses produced by the magnetizing coil 12. The magnetizing pulse detector 20 includes a measuring coil 22 and a pulse detection circuit 24 configured to validate and measure parameters of magnetizing pulses produced by the magnetizing coil 12, and to provide detector outputs 28. The magnetizing coil 12 can be a Helmholtz coil. The magnetizing coil 12 can generate a magnetizing pulse, which causes the measuring coil 22 to generate a current. The strength of the current created by the magnetizing pulse can be determined by the amount of windings in the measuring coil 22, for example 4-20 windings of copper wire. If the strength of the current is too high, it can fry a connected circuit board.

The diameter of the measuring coil 22 can be similar to the diameter of the magnetizing coil 12, and the measuring coil 22 can be placed near the magnetizing coil 12 in line with its field axis. The measuring coil 22 can be coupled to an oscilloscope to measure the amount of induction picked up by the measuring coil 22 when a magnetizing pulse is generated by the magnetizing coil 12. As an example, a measuring coil with 27 windings of standard 0.8 millimeter (mm) insulated copper wire provided a readout on an oscilloscope of a positive polarized pulse of about 100 volts, lasting about 300 microseconds (μsec). And when the magnetization polarity was reversed, the measuring coil provided a readout on the oscilloscope of a negative polarized pulse of about 100 volts, lasting about 300 psec. However, these pulses on the oscilloscope had several unwanted oscillations, which is a common phenomenon when a sudden rise of input is presented to a coil. This is often called a step response and the oscillations or ringing had an amplitude of about 60 volts peak-to-peak with a frequency of about 100 KHz.

It can be desirable to smooth the measuring pulses by reducing the oscillations or ringing in the pulses provided by measuring coil 22 to generate a cleaner signal. Resistors can be added in parallel with the measuring coil 22 to reduce this ringing, however the parallel resistors can drain the pulse down. Alternatively, capacitors can be added in parallel with the measuring coil 22 to flatten out the ringing oscillations, which can be somewhat efficient if the magnetization force does not have to be regulated.

A Zener diode can be put in parallel with the measuring coil 22 with the cathode of the Zener diode in the direction of the positive conductor of the measuring coil 22. The direction of the Zener diode should be reversed when magnetizing in the reverse polarity. The Zener diode can have a Zener voltage of 24 volts for compatibility with standard automation equipment. The Zener series impedance, for example 14 ohms (Ω), of the Zener diode short circuits the measuring coil 22, until the voltage gets lower than the specific Zener voltage, for example 24 volts. In tests, a single Zener diode in parallel with the measuring coil 22 burned out after a few attempts because the low resistance could not keep the voltage down to an acceptable level for its maximum ratings. Less resistance and voltage were desired to pull down to the desired 24 volts maximum voltage, and greater current handling capability was desired to create a more reliable circuit.

Figure 2:
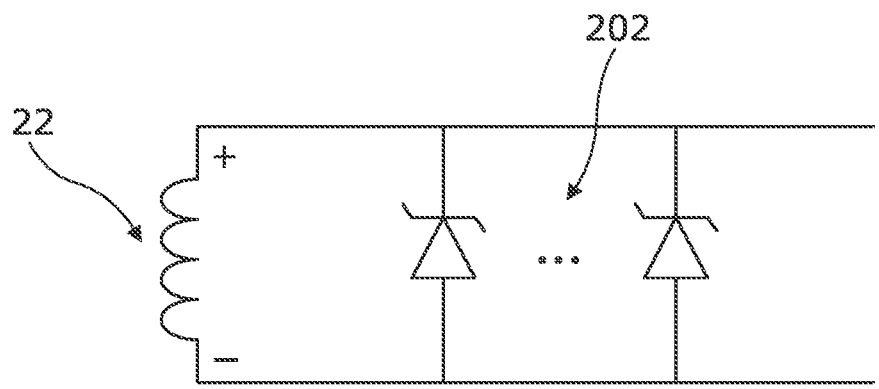
FIG. 2 illustrates a measuring coil connected in parallel with a plurality of Zener diodes.

Connecting a plurality of Zener diodes 202 in parallel with the measuring coil 22, as shown in FIG. 2, provides multiple times the current handling capability. For example, connecting six Zener diodes that have a Zener voltage of 24 volts and a Zener series impedance of 14Ω in parallel with one another and with the measuring coil 22 provides greater current handling capability and a Zener series impedance of 2.33Ω. The number of windings on the measuring coil 22 can also be reduced to further decrease the stress on the Zener diodes. For example reducing the number of windings on the measuring coil 22 down to 4 windings can decrease the measuring pulse voltage, keep the current down to a level that the Zener diodes 202 can handle, and ensure that the measuring pulse voltage stays in a window corresponding to 60-100% magnetizing force (for example 23-30 volts).

Figure 3:
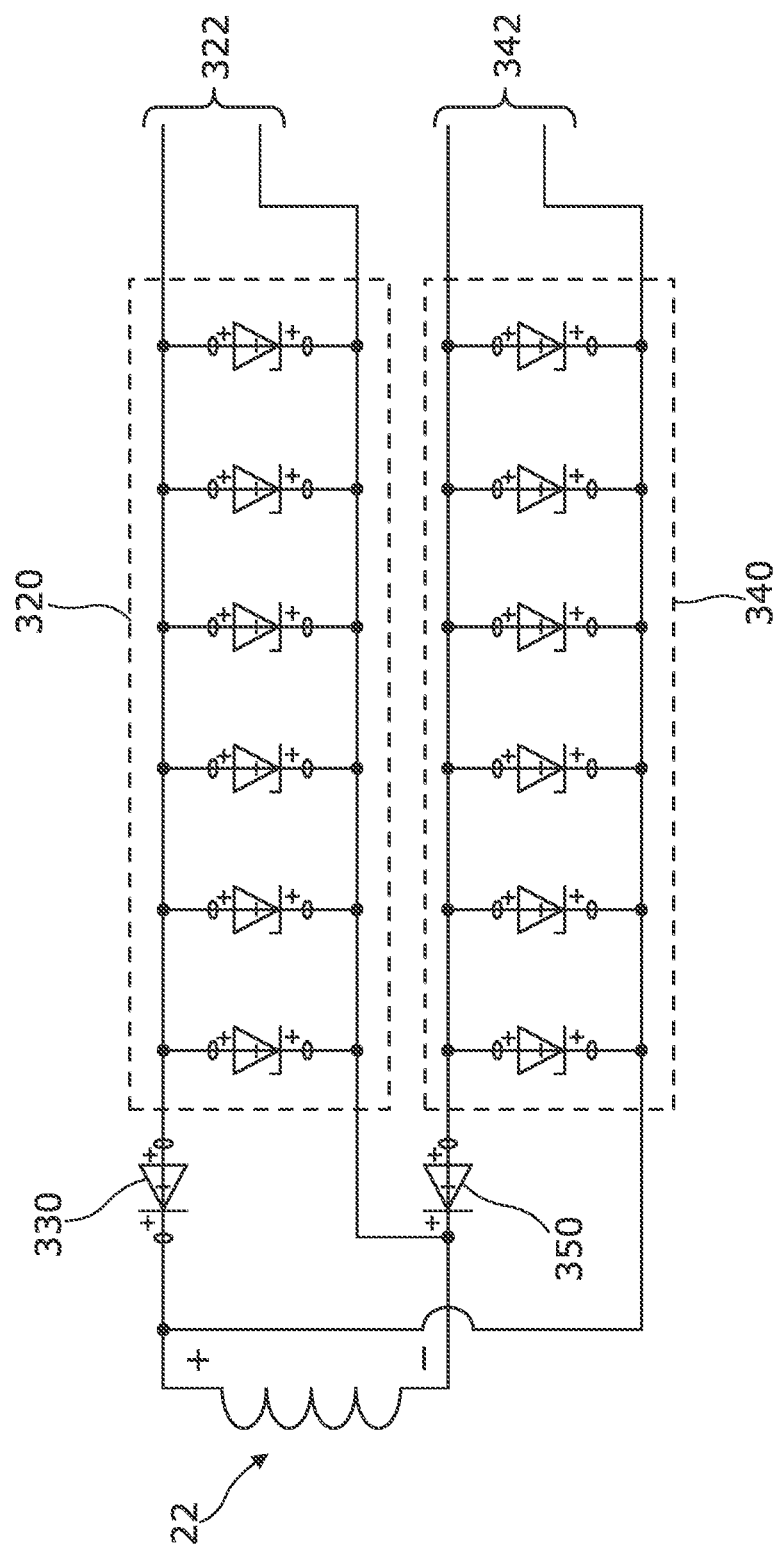
FIG. 3 illustrates an exemplary embodiment of a portion of a magnetizing pulse measuring device with first and second banks of parallel Zener diodes, and first and second rectifier diodes.

It would be desirable for the magnetizing pulse measuring device 20 to detect the magnetizing pulse of the magnetizing coil 12 regardless of its polarity. FIG. 3 illustrates an exemplary embodiment of a magnetizing pulse measuring device with a first bank of parallel Zener diodes 320, a second bank of parallel Zener diodes 340, a first rectifier diode 330 and a second rectifier diode 350. The positive side of the measuring coil 22 is connected to the anodes of the first bank of Zener diodes 320 through the first rectifier diode 330, and the negative side of the measuring coil 22 is connected to the cathodes of the first bank of Zener diodes 320. The negative side of the measuring coil 22 is connected to the anodes of the second bank of Zener diodes 340 through the second rectifier diode 350, and the negative side of the measuring coil 22 is connected to the anodes of the second bank of Zener diodes 340. The first and second rectifier diodes 330, 350 can be ultrafast rectifier diodes, capable of high current and high voltage handling. As shown in FIG. 3, the two rectifier diodes 330, 350 are mounted before the two bank of Zener diodes 320, 340 to steer a measuring pulse produced by the measuring coil 22 to one or the other of the first and second banks of Zener diodes 320, 340 depending on the polarity of the measuring pulse. When a positive polarity magnetizing pulse is generated by the magnetizing coil 12, the measuring coil 22 picks up a positive polarity pulse which the first rectifier diode 330 blocks and the second rectifier diode 350 passes to the second bank of Zener diodes 340 which produces a positive polarity detection signal on positive polarity output lines 342. When a negative polarity magnetizing pulse is generated by the magnetizing coil 12, the measuring coil 22 picks up a negative polarity pulse which the first rectifier diode 330 passes to the first bank of Zener diodes 320 and the second rectifier diode 350 blocks, and the first bank of Zener diodes 320 produces a negative polarity detection signal on negative polarity output lines 322.

It may be desirable to extend the duration of the signals on the output lines 322, 342 to ensure they can be picked up by a controller and are compatible with the I/O interface of the controller. A pulse duration of 300 μsec is too fast for a typical programmable logic controller (PLC) to pick up. A PLC typically needs a pulse duration of about 500 msec, since the short ON signal produced by a short duration pulse could be missed in between the scan times in the program routines of the PLC. The pulse duration may not even be enough time to turn a mechanical relay ON, since a mechanical relay typically needs about 20 msec. Solid state relays have no moving parts, typically an optoelectronic device, and can turn ON in just 20 μsec which is fast enough to reliably detect the positive and negative polarity detection signals on the output lines 322, 342. It may also be desirable to galvanically isolate the controller from the magnetizing pulse measuring device 20.

Figure 4:
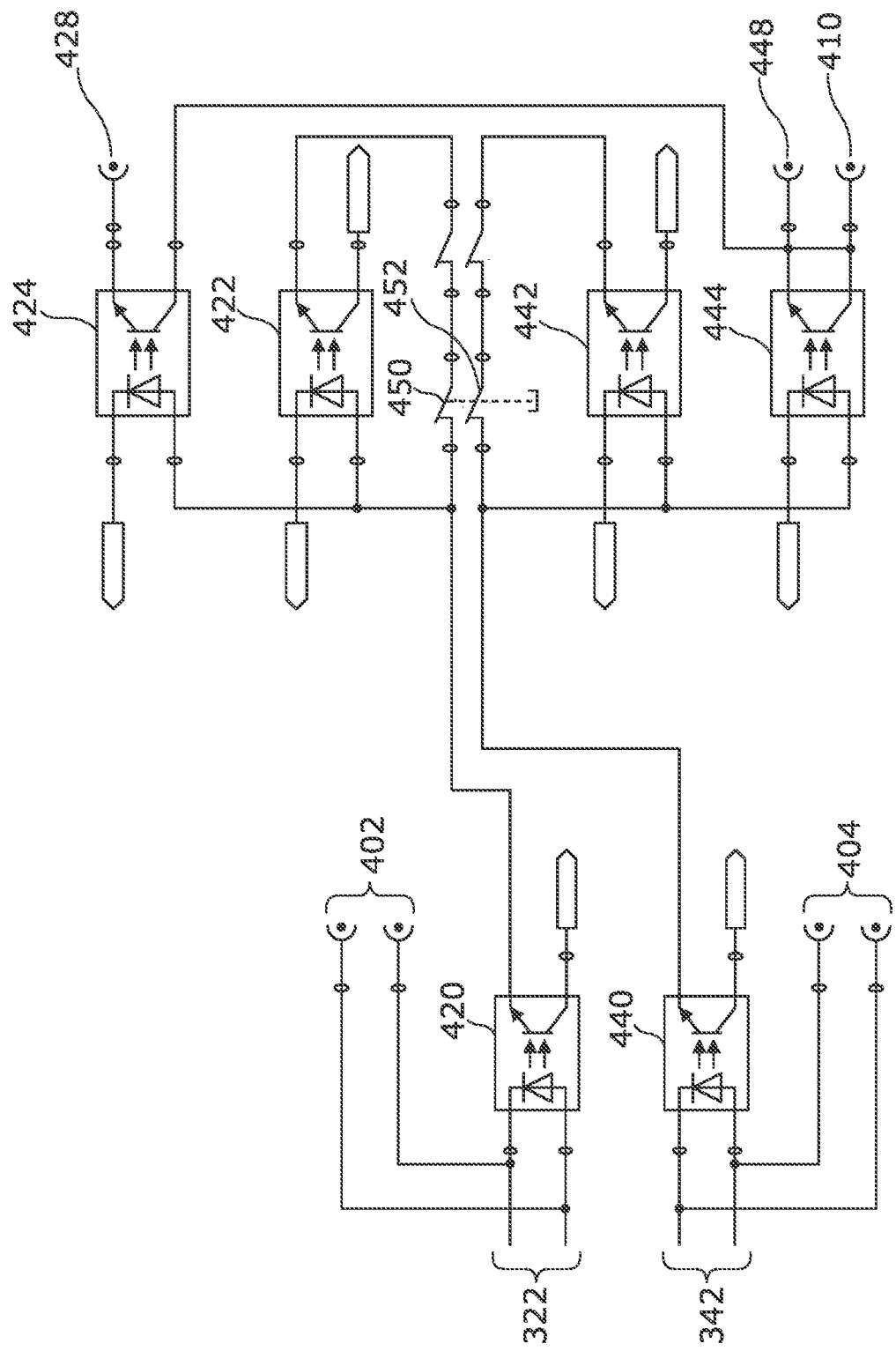
FIG. 4 illustrates an exemplary embodiment of a portion of a magnetizing pulse measuring device with solid-state relays on the positive and negative polarity output lines after the first and second banks of Zener diodes configured to hold output signals.

To ensure that a PLC is able to reliably detect the positive and negative polarity detection signals on the output lines 322, 342, multiple solid-state relays can be used after the first and second banks of Zener diodes 320, 340. FIG. 4 illustrates an exemplary embodiment with three solid-state relays 420-424 on the negative polarity output lines 322 after the first bank of Zener diodes 320; and three solid-state relays 440-442 on the positive polarity output lines 342 after the second bank of Zener diodes 340.

For the first set of relays 420-424, the first solid-state relay 420 can act as a trigger to the second solid-state relay 422, the second solid-state relay 422 can create a holding-function, and the third solid-state relay 424 can send a galvanically isolated ON signal to a PLC on negative pulse detection line 428. For the second set of relays 440-444, the first solid-state relay 440 can act as a trigger to the second solid-state relay 442, the second solid-state relay 442 can create a holding-function, and the third solid-state relay 444 can send a galvanically isolated ON signal to a PLC on positive pulse detection line 448. This holding function of the second solid-state relays 422, 442 stays ON until a reset signal terminates the closed loop of the holding function. The PLC can include a reset relay 450 which is triggered by an output from the PLC. When the PLC triggers the reset relay 450, a reset signal is sent from the reset relay 450 to terminate the closed loop of the holding function in the first set of solid-state relays 420-424 or the second set of solid-state relays 440-444. This enables the PLC to have all the time it needs to register the result, regardless of polarity direction, and send the reset signal back to the magnetizing pulse detector 20 when ready, and thereby making the magnetizing pulse detector 20 ready for a new detection.

FIG. 4 shows the negative polarity output lines 322 coupled to a triggering solid-state relay 420. The negative polarity output lines 322 can also be coupled to negative test output lines 402. The triggering solid-state relay 420 is coupled to a holding solid-state relay 422 to trigger a negative/reverse output hold function on a holding solid-state relay 422 when a negative polarity detection signal is detected on the negative polarity output lines 322. The holding solid-state relay 422 is coupled to a output solid-state relay 424 where a galvanically isolated output signal or ON signal can indicate a negative polarity detection signal to a PLC on negative pulse detection line 428. A normally closed contact 450 can be opened to interrupt the self-hold function of the triggering solid-state relay 420 on the holding solid-state relay 422.

FIG. 4 also shows the positive polarity output lines 342 coupled to a triggering solid-state relay 440. The positive polarity output lines 342 can also be coupled to positive test output lines 404. The triggering solid-state relay 440 is coupled to a holding solid-state relay 442 to trigger a positive/direct output hold function on a holding solid-state relay 442 when a positive polarity detection signal is detected on the positive polarity output lines 342. The holding solid-state relay 442 is coupled to a output solid-state relay 444 where a galvanically isolated output signal or ON signal can indicate a positive polarity detection signal to a PLC on positive pulse detection line 448. A normally closed contact 452 can be opened to interrupt the self-hold function of the triggering solid-state relay 440 on the holding solid-state relay 442.

An external input (for example, 24V input) can be provided for the galvanically isolated negative and positive outputs on the pulse detection lines 428, 448. The contacts 450, 452 that can interrupt the self-hold functions can be tied together such that triggering either contact to open will trigger both contacts 450 and 452 to open. The contacts 450, 452 can have various embodiments, for example a manual button, an externally activated relay, a timed reset, etc.

The turn ON thresholds of the solid-state relays 420-424, 440-444 can also be utilized to validate whether the magnetization by the magnetizing coil 12 of the magnetizing device 10 was successful. For example, if the solid-state relays have a turn ON threshold at 17 volts, then the solid-state relays will not turn ON if the measuring pulse from the measuring coil 22 is less than 17 volts. The magnetization force needed to reach this turn ON threshold can be determined and the circuit of the magnetizing pulse detector 20 configured to require a sufficient measuring pulse to reach this turn ON threshold. For example, if it is determined that magnetization forces under 40% do not successfully magnetize a specimen, and that the turn ON threshold for the solid-state relays 420-424, 440-444 requires at least a 52% magnetization force. Then only magnetization forces sufficient to successfully magnetize a specimen will turn ON the solid-state relays 420-424, 440-444.

Figure 5:
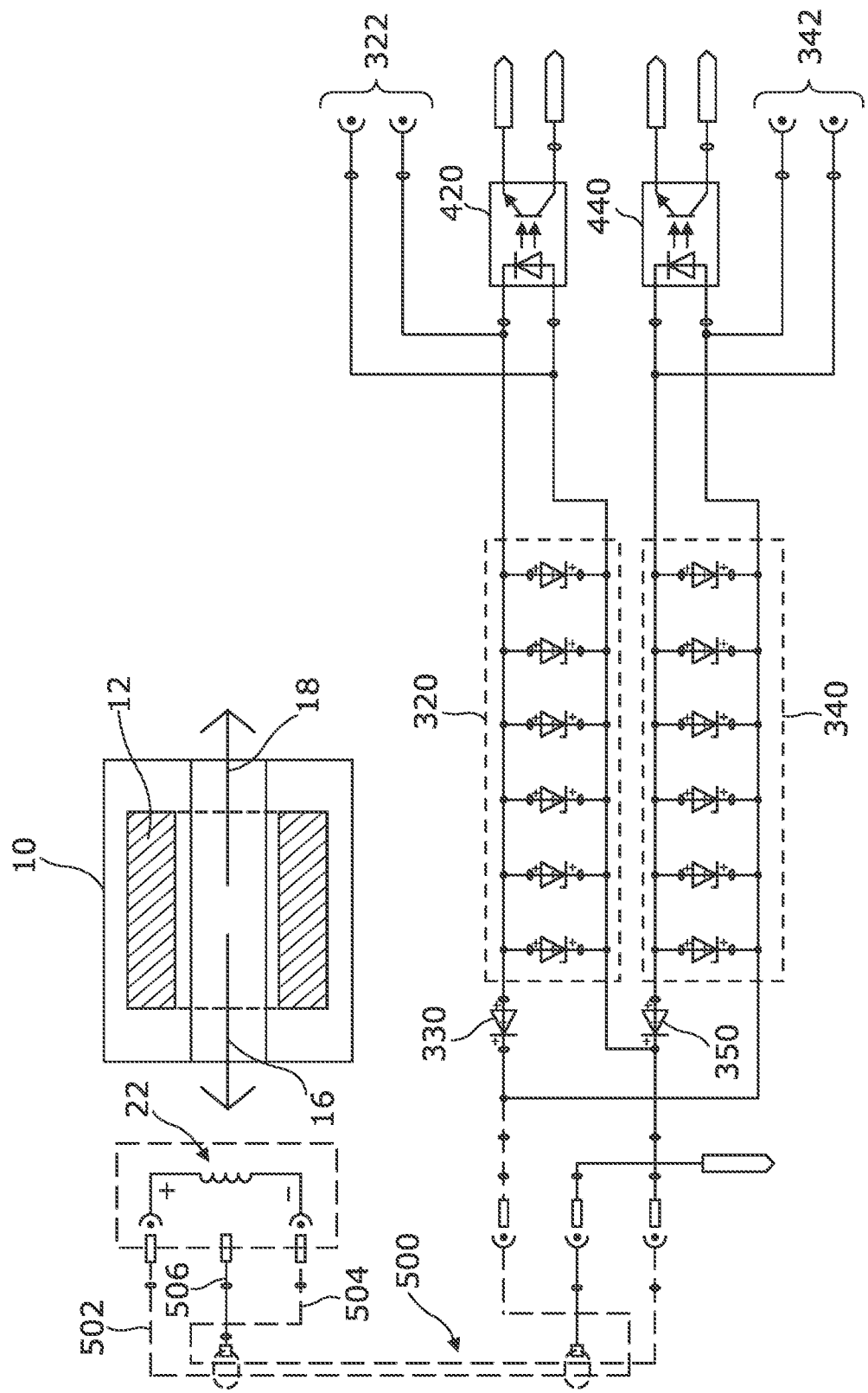
FIG. 5 illustrates a magnetizing device and an exemplary magnetizing pulse detector where the measuring coil is separately housed from the rest of the pulse detection circuit, and the measuring coil is connected to the rest of the pulse detection circuit using an XLR interconnect cable.

Since the induced energy in the measuring coil 22 can get high, it may be desirable to separate the measuring coil 22 from the pulse detection circuit 24. FIG. 5 illustrates the magnetizing device 10 and an exemplary magnetizing pulse detector 20 where the measuring coil 22 is separately housed from the rest of the pulse detection circuit 24, and the measuring coil 22 is connected to the rest of the pulse detection circuit 24 using a screened 3-pin XLR interconnect cable 500. The 3-pin XLR interconnect cable 500 includes a first line 502 coupling the positive side of the measuring coil 22 to the first rectifier diode 330, a second line 504 coupling the negative side of the measuring coil 22 to the second rectifier diode 350, and a third line 506 which is the cable screen is connected to safety earth (PE) to discharge energy if the cable 500 is broken. The XLR interconnect cable 500 also provides the possibility of making a safe end when disconnected, by means of using a female XLR connector end where there could be a voltage. As long as the Zener circuits 320, 340 are connected to the measuring coil 22, no hazardous voltages are reached. But if the XLR interconnect cable 500 is disconnected from the Zener circuits 320, 340, voltages can reach up to 60 volts. The risk of electric shock can be reduced by using a female XLR connector on the housing of the measuring coil 22 for connection by a male XLR connector on that end of the XLR interconnect cable 500.

While the disclosure has been illustrated and described in detail in the drawings and foregoing description, such illustration and description is to be considered as exemplary and not restrictive in character, it being understood that illustrative embodiment(s) have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

The invention claimed is:

1. A magnetizing pulse detector that detects magnetizing pulses produced by a magnetizing coil; the magnetizing pulse detector comprising:
   a measuring coil configured to generate a measuring pulse in response to a magnetizing pulse produced by the magnetizing coil;
   a measuring pulse detection circuit configured to generate a detection signal based on the measuring pulse generated by the measuring coil; and
   a duration extension circuit configured to generate an extended detection signal based on the detection signal generated by the measuring pulse detection circuit;
   a first measuring pulse smoothing portion configured to smooth oscillations in the measuring pulse;
   a second measuring pulse smoothing portion configured to smooth oscillations in the measuring pulse; and
   a steering portion configured to direct a negative polarity measuring pulse to the first measuring pulse smoothing portion, and to direct a positive polarity measuring pulse to the second measuring pulse smoothing portion;
   wherein the measuring pulse detection circuit comprises a plurality of Zener diodes connected in parallel to one another and connected in parallel with the measuring coil;
   wherein the duration extension circuit is configured to trigger only when the detection signal exceeds a pulse threshold that indicates the magnetizing pulse produced by the magnetizing coil was sufficient to successfully magnetize a specimen and to remain triggered for a duration of a holding function of the duration extension circuit;
   wherein the first measuring pulse smoothing portion generates a negative polarity detection signal when the negative polarity measuring pulse is directed to the first measuring pulse smoothing portion, and the second measuring pulse smoothing portion generates a positive polarity detection signal when the positive polarity measuring pulse is directed to the second measuring pulse smoothing portion;
   wherein the duration extension circuit comprises a negative pulse detection circuit configured to trigger based on the negative polarity detection signal and a positive pulse detection circuit configured to trigger based on the positive polarity detection signal;
   wherein the negative pulse detection circuit is configured to trigger only when the negative polarity detection signal exceeds a negative pulse threshold that indicates the magnetizing pulse produced by the magnetizing coil was sufficient to successfully magnetize a specimen with negative polarity; and
   the positive pulse detection circuit is configured to trigger only when the positive polarity detection signal exceeds a positive pulse threshold that indicates the magnetizing pulse produced by the magnetizing coil was sufficient to successfully magnetize the specimen with positive polarity.

2. The magnetizing pulse detector of claim 1, wherein each of the Zener diodes of the plurality of Zener diodes has a Zener voltage of 24 volts.

3. The magnetizing pulse detector of claim 1, wherein the measuring pulse detection circuit further comprises a rectifier diode, where the cathode of the rectifier diode is coupled to one of the positive and the negative sides of the measuring coil, and the anode of the rectifier diode is coupled to the anodes of the plurality of parallel-connected Zener diodes.

4. The magnetizing pulse detector of claim 1, wherein the duration extension circuit comprises a detection signal hold relay configured to hold the detection signal until reset by a reset signal.

5. The magnetizing pulse detector of claim 1, wherein the steering portion comprises first and second rectifier diodes;
   wherein the cathode of the first rectifier diode is connected to a positive side of the measuring coil to pass a negative polarity measuring pulse to the first measuring pulse smoothing portion and to block a positive polarity measuring pulse; and
   wherein the cathode of the second rectifier diode is connected to a negative side of the measuring coil to pass a positive polarity measuring pulse to the second measuring pulse smoothing portion and to block a negative polarity measuring pulse.

6. The magnetizing pulse detector of either of claim 5, wherein the measuring coil is enclosed in a first housing, the measuring pulse detection and duration extension circuits are enclosed in a second housing, and an interconnect cable connects the first and second housings; the interconnect cable comprising:
   a first line configured to couple the positive side of the measuring coil to the cathode of the first rectifier diode;
   a second line configured to couple the negative side of the measuring coil to the cathode of the second rectifier diode; and
   a cable screen configured to couple to safety earth.

7. The magnetizing pulse detector of claim 1, wherein the negative pulse detection circuit comprises a negative pulse detection hold relay configured to hold the extended detection signal until reset by a reset signal; and wherein the positive pulse detection circuit comprises a positive pulse detection hold relay configured to hold the extended detection signal until reset by the reset signal.

8. The magnetizing pulse detector of claim 7, wherein the negative pulse detection hold relay is a solid state relay; and the positive pulse detection hold relay is a solid state relay.

9. The magnetizing pulse detector of claim 8, wherein the negative pulse detection hold relay is configured to trigger only when the negative polarity detection signal exceeds a negative pulse threshold that indicates the magnetizing pulse produced by the magnetizing coil was sufficient to successfully magnetize a specimen with negative polarity; and
   the positive pulse detection hold relay is configured to trigger only when the positive polarity detection signal exceeds a positive pulse threshold that indicates the magnetizing pulse produced by the magnetizing coil was sufficient to successfully magnetize the specimen with positive polarity.

10. The magnetizing pulse detector of claim 9, wherein the reset signal is generated external to the duration extension circuit.

11. The magnetizing pulse detector of claim 1, wherein the measuring coil is enclosed in a first housing, and the measuring pulse detection and duration extension circuits are enclosed in a second housing.

12. A magnetizing pulse detector that detects magnetizing pulses produced by a magnetizing coil, the magnetizing pulse detector comprising:
   a measuring coil configured to generate a measuring pulse in response to a magnetizing pulse produced by the magnetizing coil;
   a measuring pulse detection circuit configured to generate a detection signal based on the measuring pulse generated by the measuring coil; and
   a duration extension circuit configured to generate an extended detection signal based on the detection signal generated by the measuring pulse detection circuit;
   wherein the measuring pulse detection circuit comprises:
   a first measuring pulse smoothing portion configured to smooth oscillations in the measuring pulse;
   a second measuring pulse smoothing portion configured to smooth oscillations in the measuring pulse;
   a steering portion configured to direct a negative polarity measuring pulse to the first measuring pulse smoothing portion, and to direct a positive polarity measuring pulse to the second measuring pulse smoothing portion;
   wherein the first measuring pulse smoothing portion generates a negative polarity detection signal when the negative polarity measuring pulse is directed to the first measuring pulse smoothing portion, and the second measuring pulse smoothing portion generates a positive polarity detection signal when the positive polarity measuring pulse is directed to the second measuring pulse smoothing portion;
   wherein the duration extension circuit comprises:
   a negative pulse detection circuit configured to trigger based on the negative polarity detection signal; and
   a positive pulse detection circuit configured to trigger based on the positive polarity detection signal;
   wherein the negative pulse detection circuit is configured to trigger only when the negative polarity detection signal exceeds a negative pulse threshold that indicates the magnetizing pulse produced by the magnetizing coil was sufficient to successfully magnetize a specimen with negative polarity; and
   the positive pulse detection circuit is configured to trigger only when the positive polarity detection signal exceeds a positive pulse threshold that indicates the magnetizing pulse produced by the magnetizing coil was sufficient to successfully magnetize the specimen with positive polarity.

13. The magnetizing pulse detector of claim 12, wherein the steering portion comprises first and second rectifier diodes;
   wherein the cathode of the first rectifier diode is connected to a positive side of the measuring coil to pass a negative polarity measuring pulse to the first measuring pulse smoothing portion and to block a positive polarity measuring pulse; and
   wherein the cathode of the second rectifier diode is connected to a negative side of the measuring coil to pass a positive polarity measuring pulse to the second measuring pulse smoothing portion and to block a negative polarity measuring pulse.

14. The magnetizing pulse detector of claim 13, wherein the first measuring pulse smoothing portion comprises a first plurality of Zener diodes connected in parallel, and the second measuring pulse smoothing portion comprises a second plurality of Zener diodes connected in parallel; and
   wherein the anode of the first rectifier diode is connected to the anodes of the first plurality of Zener diodes, and the anode of the second rectifier diode is connected to the anodes of the second plurality of Zener diodes.

15. The magnetizing pulse detector of claim 13, wherein the measuring coil is enclosed in a first housing, the measuring pulse detection and duration extension circuits are enclosed in a second housing, and an interconnect cable connects the first and second housings;

the interconnect cable comprising:
- a first line configured to couple the positive side of the measuring coil to the cathode of the first rectifier diode;
- a second line configured to couple the negative side of the measuring coil to the cathode of the second rectifier diode; and
- a cable screen configured to couple to safety earth.

16. The magnetizing pulse detector of claim 12, wherein the negative pulse detection circuit comprises a negative pulse detection hold relay configured to hold the extended detection signal until reset by a reset signal; and wherein the positive pulse detection circuit comprises a positive pulse detection hold relay configured to hold the extended detection signal until reset by the reset signal.

17. The magnetizing pulse detector of claim 16, wherein the negative pulse detection hold relay is a solid state relay; and the positive pulse detection hold relay is a solid state relay.

18. The magnetizing pulse detector of claim 17, wherein the negative pulse detection hold relay is configured to trigger only when the negative polarity detection signal exceeds a negative pulse threshold that indicates the magnetizing pulse produced by the magnetizing coil was sufficient to successfully magnetize a specimen with negative polarity; and the positive pulse detection hold relay is configured to trigger only when the positive polarity detection signal exceeds a positive pulse threshold that indicates the magnetizing pulse produced by the magnetizing coil was sufficient to successfully magnetize the specimen with positive polarity.

19. The magnetizing pulse detector of claim 18, wherein the reset signal is generated external to the duration extension circuit.

20. The magnetizing pulse detector of claim 12, wherein the measuring coil is enclosed in a first housing, and the measuring pulse detection and duration extension circuits are enclosed in a second housing.

* * * * *